United States Patent
Nixon (10) Patent No.: US 10,277,239 B2
(45) Date of Patent: Apr. 30, 2019

(54) AVERAGING MODULES

(71) Applicant: Hewlett Packard Enterprise Development LP, Houston, TX (US)

(72) Inventor: Walter Timothy Nixon, Fremont, CA (US)

(73) Assignee: HEWLETT PACKARD ENTERPRISE DEVELOPMENT LP, Houston, TX (US)

(*) Notice: Subject to any disclaimer, the term of this patent is extended or adjusted under 35 U.S.C. 154(b) by 0 days.

(21) Appl. No.: 15/757,003

(22) PCT Filed: Sep. 11, 2015

(86) PCT No.: PCT/US2015/049764
§ 371 (c)(1),
(2) Date: Mar. 2, 2018

(87) PCT Pub. No.: WO2017/044128
PCT Pub. Date: Mar. 16, 2017

(65) Prior Publication Data
US 2018/0269887 A1    Sep. 20, 2018

(51) Int. Cl.
*G06J 1/00* (2006.01)
*H03M 1/06* (2006.01)
*H03M 1/08* (2006.01)
*H03M 1/12* (2006.01)

(52) U.S. Cl.
CPC ............ *H03M 1/0658* (2013.01); *G06J 1/00* (2013.01); *H03M 1/08* (2013.01); *H03M 1/12* (2013.01)

(58) Field of Classification Search
CPC ......... H03M 1/0658; H03M 1/08; H03M 1/12

USPC ................................................. 341/118, 155
See application file for complete search history.

(56) References Cited

U.S. PATENT DOCUMENTS

| | | | |
|---|---|---|---|
| 6,317,071 B1 * | 11/2001 | Kolrud | H03M 1/20 341/115 |
| 6,512,523 B1 | 1/2003 | Gross | |
| 7,932,846 B2 * | 4/2011 | Imai | H03M 1/0658 341/118 |
| 7,948,267 B1 | 5/2011 | Mauer et al. | |

(Continued)

FOREIGN PATENT DOCUMENTS

| CN | 103281083 | 9/2013 |
|---|---|---|
| WO | WO-13185265 | 12/2013 |

OTHER PUBLICATIONS

"Notification of Transmittal of the International Search Report and the Written Opinion of the International Searching Authority" cited in PCT/US2015/049764; dated Jun. 29, 2016; 13 pages.

*Primary Examiner* — Khai M Nguyen
(74) *Attorney, Agent, or Firm* — Hewlett Packard Enterprise Patent Department (57) ABSTRACT

Examples disclosed herein relate to averaging modules. For example, a method may include obtaining, by an analog-to-digital converter (ADC), a plurality of samples of an input analog signal. The method may also include determining, by an averaging module, a sum value of the plurality of samples, such that a set of most significant bits of the sum value represent an average value of the plurality of samples. The method may further include determining the average value based at least on the set of most significant bits, and outputting the average value to a bus coupled to a memory module.

14 Claims, 5 Drawing Sheets

(56) References Cited

U.S. PATENT DOCUMENTS

| | | |
|---|---|---|
| 8,130,129 B2 | 3/2012 | Oettinger |
| 8,378,869 B2 | 2/2013 | Chae |
| 8,754,800 B2 | 6/2014 | Cowley |
| 2005/0057387 A1 | 3/2005 | Janakiraman et al. |
| 2007/0120720 A1 | 5/2007 | Xu |
| 2008/0059550 A1 | 3/2008 | Ohkubo |

* cited by examiner

AVERAGING MODULES

BACKGROUND

Many electronic systems today employ one or more analog-to-digital converters (ADC) to convert, for example, analog input signals into digital signals that can then be processed by digital circuitry and/or software. Various factors, such as noise included in the analog input signal and/or noise introduced by the ADC during the conversion, the output digital signal may not always accurately represent the value represented by the analog input signal.

BRIEF DESCRIPTION OF THE DRAWINGS

The following detailed description references the drawings, wherein.

DETAILED DESCRIPTION

As mentioned above, an ADC may sometimes inaccurately represent the value associated with the analog signal. In order to improve accuracy, in some examples, multiple digital samples of the analog signal may be captured and an average value of the multiple digital samples may be determined. By averaging the signal, some types of noises or variations may be reduced or eliminated. In some systems, the frequency with which the averaging operation is to be performed is so high that performing the averaging operation in software (e.g., by a CPU processor) may not be practical or feasible. Performing high-frequency averaging operations in hardware may also be a computationally intensive, power consuming, and costly operation, if each operation involves a division operation implemented by a general-purpose division circuitry.

Examples disclosed herein describe, among other things, an electronic device. The electronic device may include, for example, an analog-to-digital converter (ADC) to output a plurality of values, and an averaging module that includes an accumulator and a rounding correction module. The accumulator may obtain the plurality of values and to output a sum value of the plurality of values, the sum value being represented by a plurality of bits. The rounding correction module may generate a correction value based on a set of least significant bits of the plurality of bits, and to generate an average value based on the correction value and a set of most significant bits from the plurality of bits. These and other examples discussed herein may be used to sample and average one or more analog signals without using dividers or other area and power consuming circuitry, thereby increasing system performance, reducing the system's power consumption, size, and cost, and otherwise improving the system's characteristics.

Figure 1:
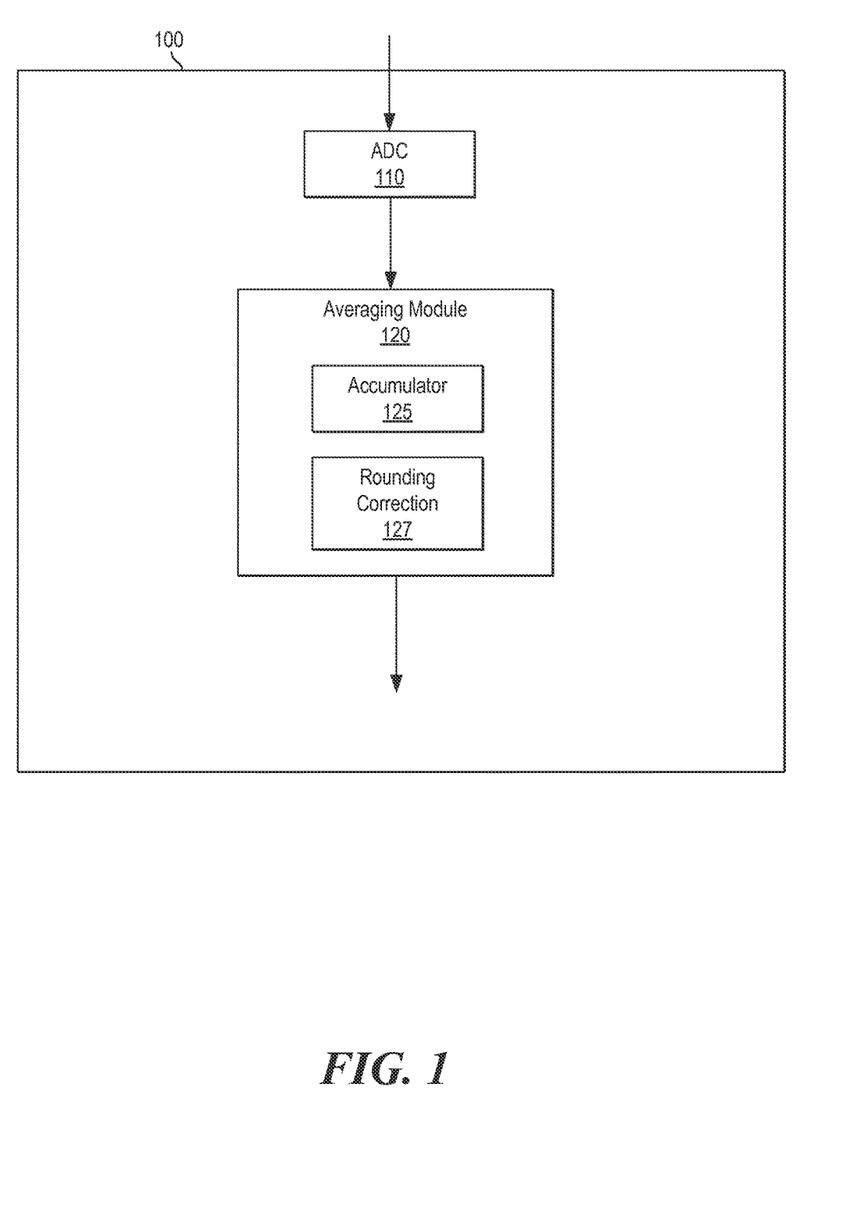
FIG. 1 is a block diagram of an example electronic device.

FIG. 1 is a block diagram of an example electronic device 100. Electronic device 100 may be any type of electronic device or a combination of electronic devices. For example, electronic device 100 may be a server, a desktop computer, a notebook computer, a tablet, a mobile phone, a smartphone, a gaming device, a printing device, and the like. In some examples, electronic device 100 may include an analog-to-digital converter (ADC) 110, and an averaging module 120. In other examples, as further discussed below, electronic device 100 may include fewer, more, and/or different components. Various components of electronic device 100 may be implemented as any combination of programming (e.g., instructions stored on a non-transitory computer-readable medium and executable by a processor (e.g., a CPU)) and hardware (e.g., semiconductor-based microprocessors, hardware state machines, graphics processing units (GPUs), field-programmable gate arrays (FPGAs), or other electronic circuitry), where the programming and/or hardware may be integrated in a single device or distributed across a number devices communicatively coupled to each other.

ADC 110 may include one or more ADC module, where each ADC module may be a direct-conversion or flash ADC, a successive-approximation ADC, a ramp-compare ADC, or any other type of ADC module capable of output digital values of analog inputs, as discussed herein. ADC 110 may obtain one or more analog signals through one or more cables (e.g., electrical cables, optical cables, etc.) or wireless channels. Each analog signal may be obtained, for example, from another electronic device, and may represent any type of data, such as communication data, audio data, and so forth. ADC 110 may sample each signal at a predefined sampling frequency, and output for each analog signal a plurality of digital values, also referred to herein as digital samples.

Averaging module 120 may, in some examples, obtain from ADC 110 digital values corresponding to one analog signal, and output an exact or an approximate average (e.g., arithmetic average) value of the digital samples. In some examples, averaging module 120 may include, among other things, an accumulator 125 and a rounding correction module 127. In other examples (e.g., examples illustrated in FIG. 3 and FIG. 4) rounding correction module 127 may be omitted from averaging module 120.

As discussed above in connection to electronic device 100, averaging module 120 and any or all of its components may also be implemented as any combination of programming and hardware. Specifically, in an example illustrated in FIG. 2, averaging module 120 includes a positive-edge detector 121, an accumulation enable register 123A, a round enable register 123B, an input register 123C, a rounding register 123E, accumulator 125 and rounding correction module 127, where accumulator 125 includes a first adder 126 and an accumulation register 123D, and rounding correction module 127 includes a second adder 128 and a correction function 129. In some examples, registers 123 may be implemented as D flip-flops or as any other suitable types of registers. In some examples, some or all components of averaging module 120 may be coupled to the same clock signal, or to a number of synchronized clock signals (not shown for brevity). It is appreciated that in other examples, some of the components illustrated in FIG. 2 may be omitted or replaced by other components, and additional components may be included to implement the functionality of averaging module 120 discussed herein.

Figure 2:
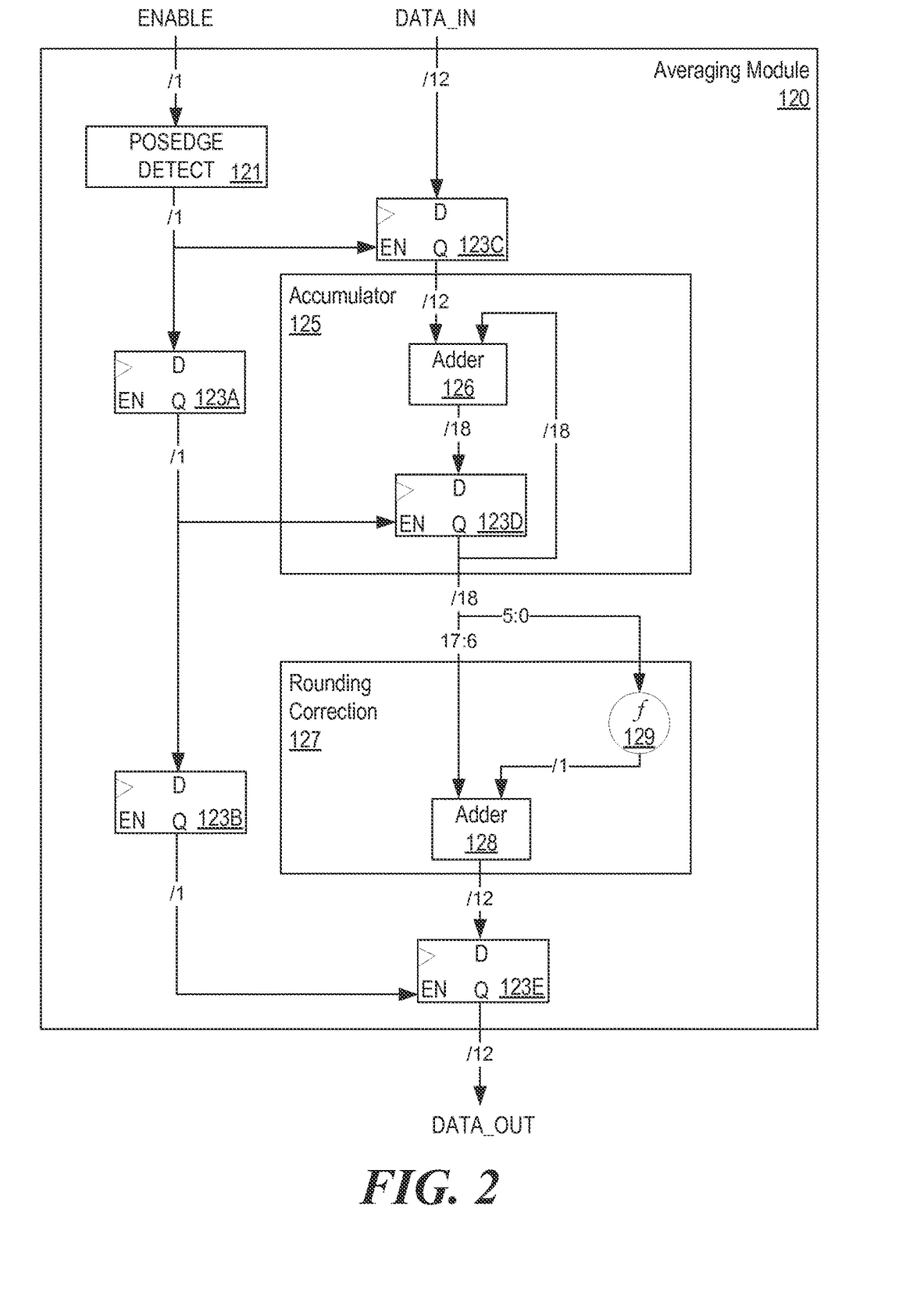
FIG. 2 is another block diagram of an example electronic device.

In the example illustrated in FIG. 2, averaging module may obtain, among other inputs, a digital input signal (indicated as DATA_IN) obtained from ADC 110, and an enable signal (indicated as ENABLE). For illustration purposes only, the input signal may be a 12-bit signal, but it is appreciated that the examples discussed herein are not limited to input signals of a particular width, and may apply to input signals of any width. The enable signal may be inputted into positive-edge detector 121, and the input signal may be inputted into input register 123C. Upon detecting a positive edge of the enable signal, detector 121 may enable input register 123C. One clock cycle later, accumulation enable register 123A may enable accumulation register 123D, and after yet another dock cycle, round enable register 123B may enable rounding register 123E. Each register 123, once enabled, may transfer the value at its input to its output, for example, at each rising edge of the clock.

Each clock cycle, first adder 126 may receive, from input register 123C, a new input value, add the input value to the accumulated value stored and outputted by accumulator register 123D, the value being initialized to zero. Thus, accumulator 125 may output, each cycle, the sum value of all input values it has received since it was enabled or reset. The number of bits representing the sum value may depend on the width of the input value and on the maximum number of input values to be accumulated. In the example illustrated in FIG. 2, the maximum number of input values to be accumulated is 64; accordingly, the sum value is represented by $12+\log_2 64=18$ bits.

In some examples, averaging module 120 may output a valid average value after obtaining and processing a power of two input values, that is, when a number of processed input values is equal to $2^N$ where N is an integer. Put differently, the output of averaging module 120 may be an average value of $2^N$ most recently processed input values. In these examples, an approximate average value of the input values may be determined by dividing the sum value of the input values by $2^N$, which may be achieved, for example, by logically shifting the sum value to the right by N bits, or disregarding the N least significant bits. To illustrate, in the example shown in FIG. 2, the number of input samples is 64 (N=6), and so out of the 18 bits representing the sum value, 12 most significant bits (i.e., bits 17:6) may represent the approximate average value, where the approximate average value may be equal to the arithmetic average value if the arithmetic average value is an integer, or equal to an integer immediately preceding the arithmetic average value if the arithmetic average value is not an integer.

In some examples, the N least significant bits of the sum value may be disregarded and averaging module 120 may output the approximate average value as the average value, as illustrated, for example, in FIG. 3 and FIG. 4, further discussed below.

In other examples, as illustrated in FIG. 2, the N least significant bits of the sum value (i.e., bits 5:0) may be provided to rounding correction module 127 together with the most significant bits (i.e., bits 17:6) representing the approximate average value. Rounding correction module 127 may then determine, based on the N least significant bits, a correction value (e.g., a 1-bit value of zero or one), and to generated an average value (also referred to as a corrected average value) based on the approximate average value and the correction value. For example, module 127 may add the correction value to the average value using a second adder 128.

In some examples, the correction value may be equal to the N-th least significant bit of the sum value (e.g., bit 5 in the example of FIG. 2), in which case module 127 may add the N-th least significant bit to the average value. In other examples, as illustrated in FIG. 2, module 127 may determine the correction value using a different function, e.g., using a function module 129. In some examples, the function may output "1" when the input is greater than $2^{N-1}$, and output "0" when the input is equal or less than $2^{N-1}$. For instance, in the example of FIG. 2, function module 129 may output "1" only if the six least significant bits of the sum value are greater than 32.

Figure 3:
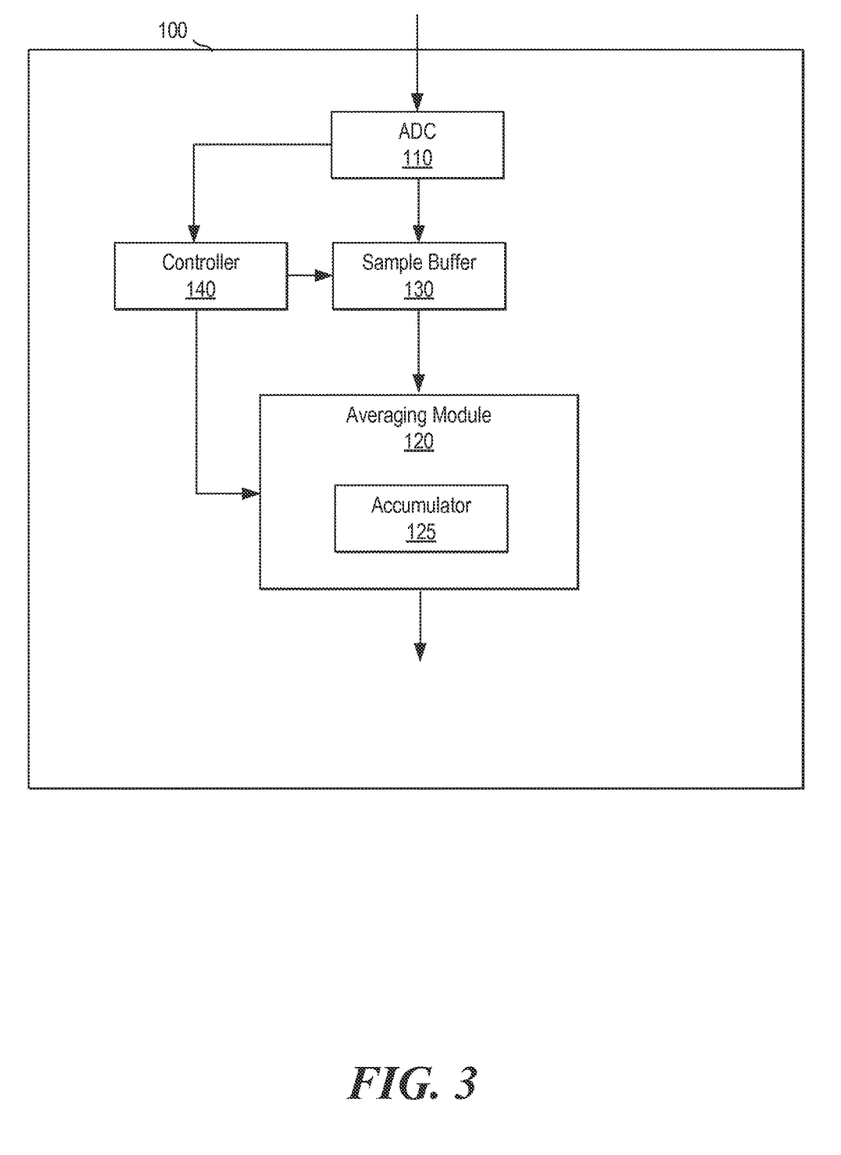
FIG. 3 is yet another block diagram of an example electronic device.

In some examples, as illustrated in FIG. 3, electronic device 100 may include, in addition to ADC 110 and averaging module 120, a sample buffer 130 and a controller 140. Sample buffer 130 may include any type of non-transitory memory such as a volatile memory (e.g., RAM) or non-volatile memory. In some examples, e.g., if averaging module 120 is processing samples at a slower rate than the rate at which ADC 110 outputs new sample, sample buffer 130 may obtain from ADC 110 and temporarily store new samples (e.g., a total of $2^N$ input values) and to provide the new samples to averaging module 120 sequentially (e.g., one sample per dock cycle) in a first-in-first-out order or in any other order. Controller 140 may use control signals to synchronize the operation of ADC 110, sample buffer 130, and averaging module 120.

Figure 4:
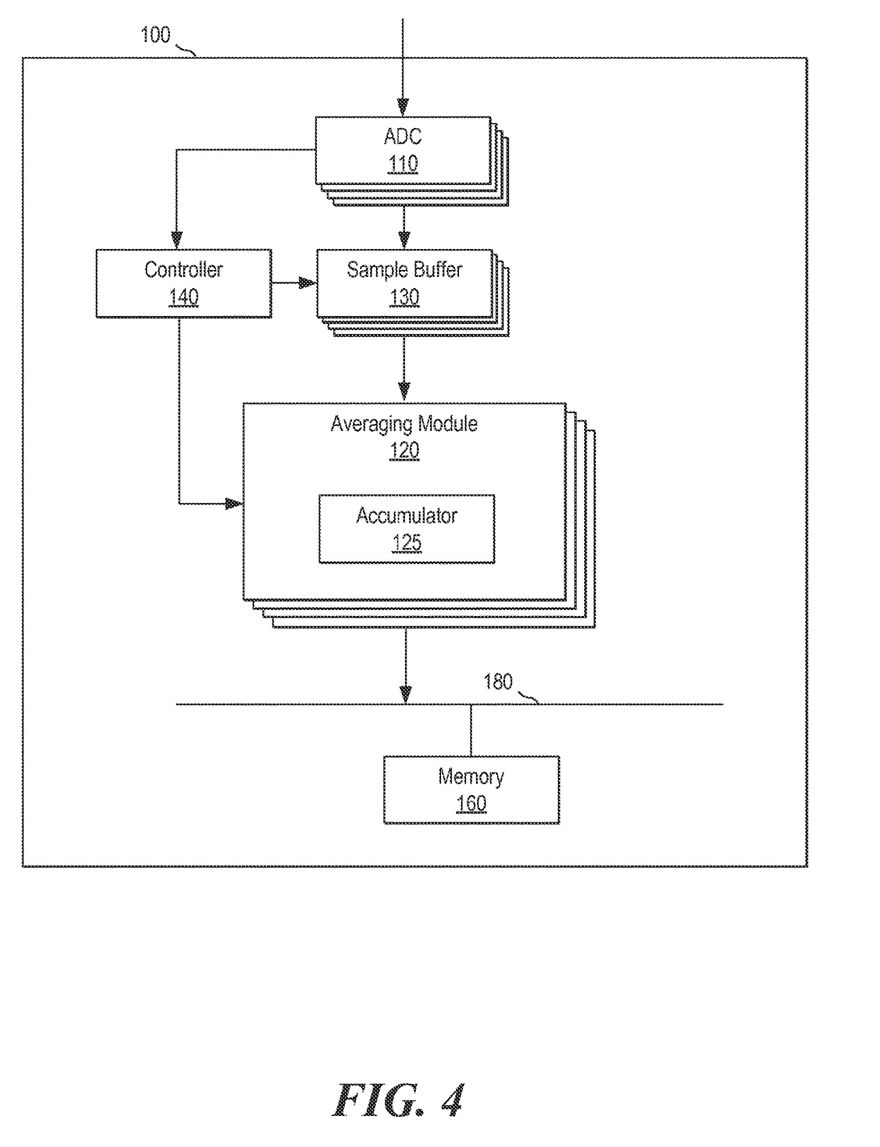
FIG. 4 is yet another block diagram of an example electronic device.

In some examples, as illustrated in FIG. 4, electronic device 100 may obtain a plurality of analog input signals, and may include a plurality of ADCs 110, where each ADC 110 is to sample one analog input signals and to output, for each analog signal, a plurality of (e.g., $2^N$) digital values. In some examples, the plurality of ADCs 110 may be implemented as a single ADC 110 that may process the plurality of analog input signals sequentially, switching from one signal to another, e.g., in a round-robin fashion. In some examples, electronic device 100 may include a plurality of sample buffers 130, where each buffer is to store a plurality of (e.g., $2^N$) digital values corresponding to one analog input signal. In some examples, the plurality of sample buffers 130 may be implemented as a single buffer or memory (e.g., a RAM). Similarly, in some examples, electronic device 100 may include a plurality of averaging modules 120, where each averaging module 120 may process digital input values corresponding to one analog input signal and output an average value of the input values. As discussed above, controller 140 may synchronize the operation of ADCs 110, sample buffers 130, and averaging modules 120.

In some examples, averaging module 120 may output the average value to a bus 180 through which the average value may be obtained by various modules of electronic device such as a memory, where the memory may include any combination of volatile and non-volatile memory, such as a random-access memory (RAM), flash memory, hard drive, and so forth. In some examples, memory 160 may include a non-transitory machine-readable storage medium.

As mentioned above, in some examples, some or all modules of electronic device 100 may be implemented as any combination of hardware and programming. The programming may include processor-executable instructions stored on a tangible, non-transitory computer readable medium and the hardware may include a processing resource for executing those instructions. The processing resource may include one or more processors, such as central processing units (CPUs) or cores thereof, semiconductor-based microprocessors, hardware state machines, graphics processing units (GPUs), field-programmable gate arrays (FPGAs), or other electronic circuitry, which may be integrated in a single device or distributed across devices. The computer readable medium can be said to store program instructions that when executed by the processor resource implement the functionality of the respective component. The computer readable medium may be integrated in the same device as the processor resource or it may be separate but accessible to that device and the processor resource. In one example, the program instructions can be part of an installation package that when installed can be executed by the processor resource to implement the corresponding component. In this case, the computer readable medium may be a portable medium such as a CD, DVD, or flash drive or a memory maintained by a server from which the installation package can be downloaded and installed. In another example, the program instructions may be part of an application or applications already installed, and the computer readable medium may include integrated memory such as a hard drive, solid state drive, or the like.

Figure 5:
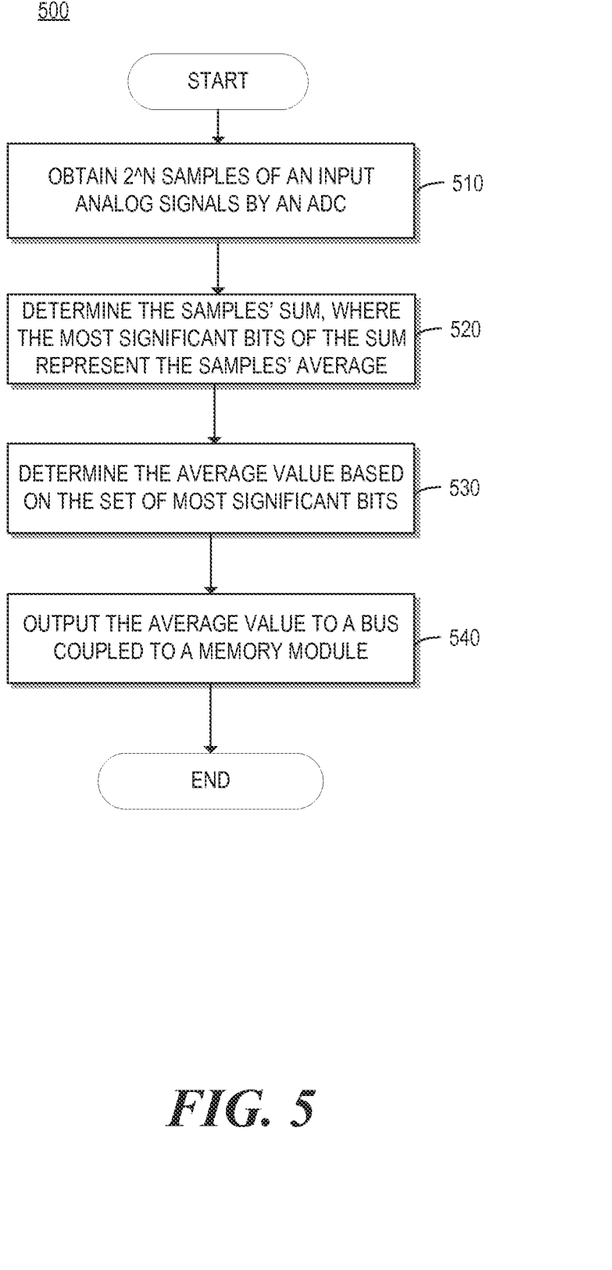
FIG. 5 is a flowchart of an example method.

FIG. 5 is a flowchart of an example method 500 for determining an average value of a plurality of samples. Method 500 may be described below as being executed or performed by an electronic device (e.g., 100), or another suitable device or module. Method 500 may be implemented in the form of executable instructions stored on at least one non-transitory machine-readable storage medium of the electronic device and executed by at least one processor of the client device. Alternatively or in addition, method 500 may be implemented in the form of electronic circuitry (e.g., hardware). In alternate examples of the present disclosure, one or more or blocks of method 500 may be executed substantially concurrently or in a different order than shown in FIG. 5. In alternate examples of the present disclosure, method 500 may include more or less blocks than are shown in FIG. 5. In some examples, one or more of the blocks of method 500 may, at certain times, be ongoing and/or may repeat.

At block 510, method 500 may, as discussed above, obtain by an analog-to-digital converter (e.g., ADC 110) a plurality of samples of an input analog signal, where the plurality of samples may include $2^N$ samples, wherein N is an integer. At block 520, the method may determine (e.g., by averaging module 120), a sum value of the plurality of samples, where a set of most significant bits of the sum value represent an average value (or at least an approximation of the average value) of the plurality of samples. At block 530, the method may determine the average value based at least on the set of most significant bits. As discussed above, this may include determining a correction value based on a set of least significant bits of the sum value, and generating the average value based on the correction value and the set of most significant bits of the sum value. At block 540, the method may output the average value to a bus (e.g., 180) coupled to a memory module (e.g., 160).

As discussed above, the method may also in some examples include storing the plurality of samples in a sample buffer and sequentially providing the plurality of samples from the sample buffer to the averaging module. In addition, the method may include obtaining, by the ADC, a second plurality of samples of a second input analog signal, the second plurality of samples including $2^N$ samples; determining, by a second averaging module (e.g., another averaging module 120), a second sum value of the second plurality of samples (where a second set of most significant bits of the second sum value represent a second average value of the second plurality of samples); determining the second average value based at least on the second set of most significant bits; and outputting the second average value to the same bus. As discussed above, in some examples, the ADC may sample the two (or more) analog signals sequentially, e.g., by first obtaining a first sample of the first analog signal, then obtaining a first sample of the second analog signal, then obtaining a second sample of the first analog signal, and so on.

The invention claimed is:

1. An electronic device comprising:
an analog-to-digital converter (ADC) to output a plurality of values;
an averaging module comprising an accumulator and a rounding correction module, wherein:
the accumulator is to obtain the plurality of values and to output a sum value of the plurality of values, the sum value being represented by a plurality of bits, and
the rounding correction module is to generate a correction value based on a set of least significant bits of the plurality of bits, and to generate an average value based on the correction value and a set of most significant bits of the plurality of bits.

2. The electronic device of claim 1, wherein the plurality of values comprises $2^N$ values, wherein N is an integer, and wherein the set of least significant bits comprises N least significant bits of the plurality of bits.

3. The electronic device of claim 2, wherein the rounding correction module is to set the correction value to "1" if the set of least significant bits represents a number greater than $2^{(N-1)}$, and to set the correction value to "0" if the set of least significant bits represents a number equal to or less than $2^{(N-1)}$.

4. The electronic device of claim 2, wherein the rounding correction module is to set the correction value to the most significant bit of the set of least significant bits.

5. The electronic device of claim 1, further comprising a sample buffer and a controller, wherein the controller is to cause the sample buffer to store the plurality of values and to sequentially provide the plurality of values to the averaging module.

6. An electronic device comprising:
an analog-to-digital converter (ADC) to sample a plurality of analog signals, and to output, for each analog signal, a plurality of digital values representing the analog signal;
a plurality of averaging modules; and
a sample buffer to store, for each analog signal, the plurality of digital values representing the analog signal, and to sequentially provide the plurality of digital values to one of the plurality of averaging modules;
wherein each averaging module comprises an accumulator to determine a sum value represented by a plurality of bits comprising a set of most significant bits and a set of least significant bits, wherein the set of most significant bits represent an average value of the plurality of digital values.

7. The electronic device of claim 6, wherein the ADC is to sample the plurality of analog signals sequentially.

8. The electronic device of claim 6, further comprising a controller to synchronize operation of the ADC, the sample buffer, and the plurality of averaging modules.

9. The electronic device of claim 6, wherein each averaging module is to output the set of most significant bits as the average value.

10. The electronic device of claim 6, wherein each averaging module further comprises a rounding correction module to generate a correction value based on the set of least significant bits, and to generate the average value based on the correction value and the set of most significant bits.

11. The electronic device of claim 6, wherein the plurality of digital values representing each analog signal comprises $2^N$ values, wherein N is an integer, and wherein the set of least significant bits comprises N least significant bits of the plurality of bits.

12. A method comprising:
obtaining, by an analog-to-digital converter (ADC), a plurality of samples of an input analog signal, the plurality of samples comprising $2^N$ samples, wherein N is an integer;
determining, by an averaging module, a sum value of the plurality of samples, wherein a set of most significant bits of the sum value represent an average value of the plurality of samples;
determining the average value based at least on the set of most significant bits, by:
   determining a correction value based on a set of least significant bits of the sum value; and
   generating the average value based on the correction value and the set of most significant bits of the sum value; and
outputting the average value to a bus coupled to a memory module.

13. The method of claim 12, further comprising storing the plurality of samples in a sample buffer and sequentially providing the plurality of samples from the sample buffer to the averaging module.

14. The method of claim 12, further comprising:
obtaining, by the ADC, a second plurality of samples of a second input analog signal, the second plurality of samples comprising $2^N$ samples;
determining, by a second averaging module, a second sum value of the second plurality of samples, wherein a second set of most significant bits of the second sum value represent a second average value of the second plurality of samples;
determining the second average value based at least on the second set of most significant bits; and
outputting the second average value to the bus.

* * * * *